May 30, 1967 W. B. MITCHELL 3,323,071

SEMICONDUCTOR CIRCUIT ARRANGEMENT UTILIZING INTEGRATED CHOPPER ELEMENT AS ZENER-DIODE-COUPLED TRANSISTOR

Filed July 9, 1964

INVENTOR
WALTER B. MITCHELL
BY
Curtis, Morris & Safford
ATTORNEYS

United States Patent Office 3,323,071

Patented May 30, 1967

3,323,071

SEMICONDUCTOR CIRCUIT ARRANGEMENT UTILIZING INTEGRATED CHOPPER ELEMENT AS ZENER-DIODE-COUPLED TRANSISTOR

Walter B. Mitchell, Danbury, Conn., assignor to National Semiconductor Corporation, Danbury, Conn.

Filed July 9, 1964, Ser. No. 381,375
1 Claim. (Cl. 330—38)

This invention relates to electrical circuit arrangements incorporating interconnected transistors and semiconductor diodes. More particularly, this invention relates to electrical circuit arrangements in which zener diodes are connected to the electrodes of transistors.

There are many circuit arrangements in which it is desired to connect a zener diode to one of the electrodes of a transistor. For example, in the 3-stage amplifier shown in FIGURE 1, D.C. interstage coupling is provided by connecting a zener diode 12 between the collector electrode of the transistor in one stage and the base electrode of the transistor in the succeeding stage. The effect of this is to raise the collector voltage of the transistor in the preceeding stage to a value considerably higher than it woud be if the amplifier stages were coupled directly.

This arrangement has many advantages. First, with higher collector voltages on each transistor, the amplifier is less sensitive to ambient temperature changes. This arrangement has the further advantage over the use of capacitors for interstage coupling in that a path is provided for the flow of direct current between stages. In addition, the frequency response of the amplifier is extended by elimination of the coupling capacitors. Furthermore, the zener diode has a lower dynamic impedance than a suitable resistor would have if it were used instead, with the result that the amplifier 10 has more gain and faster response than would a resistor-coupled circuit.

Figure 2:
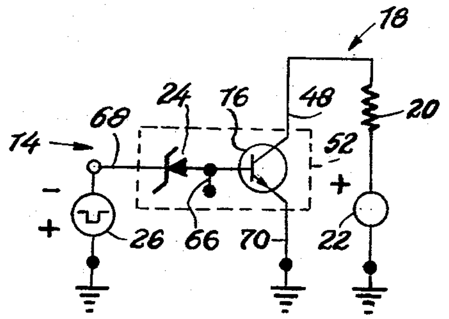
FIGURE 2 is a schematic circuit diagram of a well-known zener diode switching circuit.

The switching circuit 14 shown in FIGURE 2 is another example of the many circuits using a zener diode connected to an electrode of a transistor. Switching circuit 14 includes a transistor 16 and electrical source 22. Load circuit 18 is connected in series with the collector and emitter electrodes of transistor 16. The anode of a zener diode 24 is connected to the base electrode of transistor 16. A variable-level switching signal source 26 is connected to the cathode of zener diode 24.

Switching source 26 supplies a direct negative voltage varying in magnitude below and above the zener breakdown voltage of zener diode 24. When the voltage of the signal supplied by switching source 26 is below (has a greater negative magnitude than) the zener breakdown voltage for diode 24, diode 24 conducts and switches transistor 16 into a conductive state so that a signal is delivered to load resistor 20 from source 22. When the voltage of source 26 is above the zener breakdown voltage, diode 24 does not conduct, transistor 16 is "turned-off," and no signal is delivered to load resistor 20.

When made by ordinary techniques, the amplifier 10 requires three transistor elements and two separate zener diodes. Similarly, switching circuit 14 requires a separate transistor and a separate zener diode. In accordance with the present invention, however, applicant has utilized one well-known semiconductor circuit element in a novel way to replace a transistor and a separately-connected zener diode.

Figure 3:
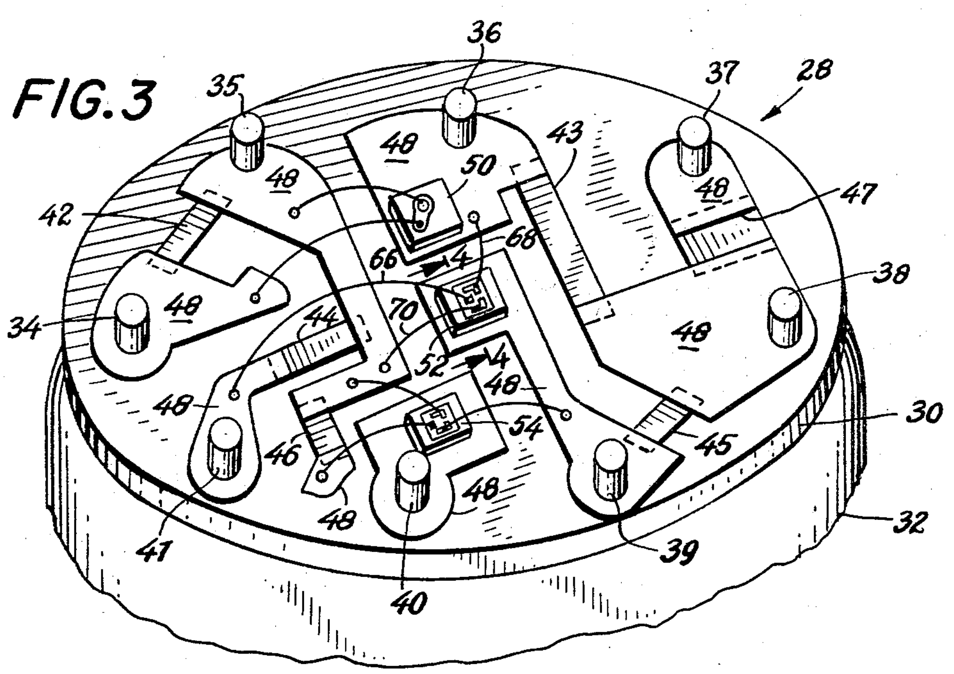
FIGURE 3 is a perspective view of an integrated thin-film amplifier embodying the present invention.
Figure 1:
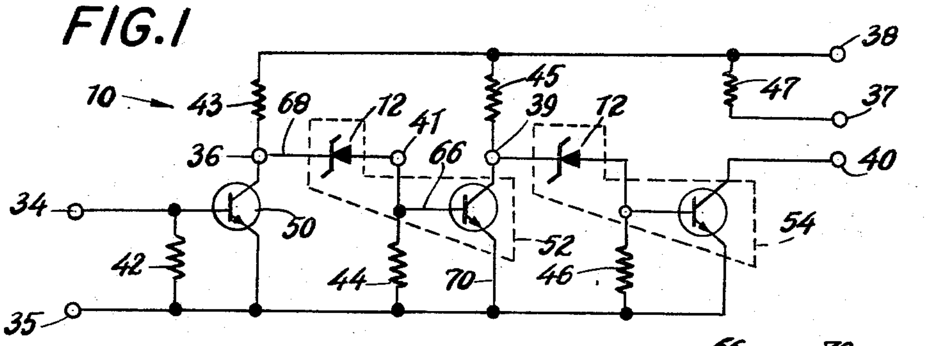
FIGURE 1 is a schematic circuit diagram of a well-known multistage electrical amplifier using zener diodes to interconnect its stages.

In FIGURE 3 is shown an integrated thin-film amplifier having the schematic circuit diagram shown in FIGURE 1 but, in accordance with the present invention, utilizing only three individual circuit elements instead of the five normally used.

Integrated amplifier 28 is assembled by use of well-known techniques. A ceramic base 30 is mounted on a metallic header 32. Then, thin-film resistors 42 through 47 correspond, respectively, to the resistors bearing the same numbers in the FIGURE 1 circuit. The thin-film metallic areas 48 provide interconnections between the resistors and active elements of the circuit, and provide bases upon which the active elements are mounted. Metallic connection posts 34 through 41 are mounted in the circuit structure. These posts pass through the header 32 and the base 30 and project above the surface of the base to serve as external connection leads. Posts 34 through 41 correspond, respectively, to terminals 34 through 41 of the FIGURE 1 arrangement.

A double-diffused transistor 50 is alloyed to the metallic film connected to post 36. Thus, this metallic film serves as the collector terminal for the transistor. Two semiconductor elements 52 and 54 are alloyed, respectively, to the metallic film connected to pin 39 and the metal connected to pin 40.

Devices 52 and 54 are integrated chopper semiconductor devices sold under the trademark "INCH" by National Semiconductor Corporation, Danbury, Conn. The structure and operation of these devices is fully described in United States patent application Ser. No. 269,012 filed Mar. 29, 1963 and in National Semiconductor Corporation "General Engineering Memo #7" published June 1, 1962. However, a cross-sectional view taken along line 4—4 of FIGURE 3 is provided in FIGURE 4 to show the basic construction of elements 52 and 54 for the sake of convenience.

Figure 4:
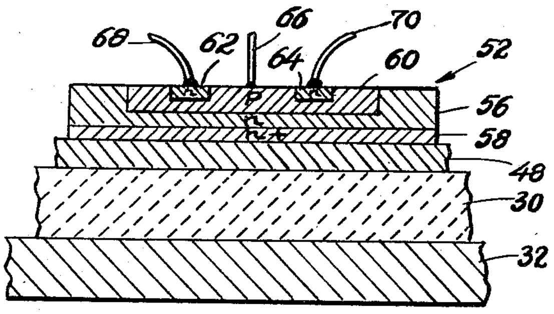
FIGURE 4 is a cross-sectional view taken along line 4—4 of FIGURE 3.

Referring now to FIGURE 4, both devices 52 and 54 comprise an n-type silicon wafer 56 having an n+ lower region 58, an upper diffused p-region 60 and two n-type regions 62 and 64 diffused into region 60 at spaced intervals from one another. Devices 52 and 54 are four-terminal circuit elements; bottom terminal 48 and terminal 66 comprising input control signal terminals, and terminals 68 and 70 which are connected to regions 62 and 64, comprising output signal terminals. Ordinarily, a load circuit is connected between terminals 68 and 70 and conduction between them is controlled by a signal applied to terminals 48 and 66.

As described in the above-identified publication, the devices 52 and 54 normally are used in "chopper" circuits; i.e., in circuits utilizing A.C. signals to modulate a D.C. input signal, the D.C. signal is applied to the terminals 68 and 70 and the A.C. signal to terminals 58 and 66.

In accordance with the present invention, however, one of terminals 68 and 70 is used as the emitter of an ordinary transistor, terminal 66 is used as the base terminal of the transistor and terminal 48 is used as the collector terminal. The other of terminals 68 and 70 is used as the cathode terminal of a zener diode whose anode is connected internally to the base electrode 66 of the transistor. In this manner, the standard, well-known device 52 or 54 is used to replace the circuit combination of a separate transistor whose base is connected to the anode of the separate zener diode.

Similarly, element 52 can be used to replace transistor 16 and zener diode 24 in switching circuit 14 shown in FIGURE 2. In FIGURES 2 and 3 and throughout the drawings corresponding numerals are used to indicate corresponding terminals of device 52.

Ordinarily, zone 62 and 64 are diffused in element 52 in a manner such that they are substantially identical. However, if desired, the one of zones 62 and 64 to be used as a part of the zener diode may be diffused differently from the other zone, by known techniques, in order to give it a desired zener break-down voltage.

The advantages of applicant's use of a single, readily available circuit element to replace two separate circuit elements has many advantages. In addition to the abovementioned saving in circuit components, since the zener diode and transistor are positioned closely adjacent one another in a single substrate, temperature differences between the two elements are minimized. In addition, by interconnecting the zener diode and transistor internally, the thermocouples which normally would be formed by joining the transistor and zener diode terminals are eliminated, thus reducing a potential source of error voltages in the circuit. Thus, applicant's invention provides significant savings in space, cost, and circuit complexity in circuits using diode and transistor combinations, and yet uses only standard, readily available active circuit elements.

The above description of the invention is intended to be illustrative and not in limitation thereof. Various changes or modifications in the embodiments described may occur to those skilled in the art and these can be made without departing from the spirit or scope of the invention.

I claim:

A multistage electrical amplifier comprising in combination, a ceramic insulating substrate, at least two amplifier stages constructed upon said substrate, at least one stage including an integrated chopper element, said integrated chopper circuit element comprising a die of semiconductor material having a first type of conductivity, a first region in said die, said first region having a second type of conductivity which is opposite to said first type, second and third regions in said first region, said second and third regions having said first type of conductivity, and first, second, third and fourth terminal means, said first terminal means making ohmic contact with said die, said second terminal means making ohmic contact with said first region, said third terminal means making ohmic contact with said second region, and said fourth terminal means making ohmic contact with said third region, the other of said two stages including another semiconductor die forming a transistor mounted on said substrate with two zones of one conductivity type and an intermediate region of an opposite conductivity type, said fourth terminal means being connected to one of said two zones of said transistor, a resistor connected between the other of said two zones of said transistor and said second terminal means, one of said first and third terminal means also being connected to said other zone of said transistor, and a load impedance connected between said first and third terminal means.

References Cited

UNITED STATES PATENTS

| | | | |
|---|---|---|---|
| 3,121,175 | 2/1964 | Vigneron | 330—19 X |
| 3,138,747 | 6/1964 | Stewart | 330—39 X |
| 3,153,731 | 10/1964 | Shombert | 307—88.5 X |
| 3,209,279 | 9/1965 | Kambouris | 307—88.5 X |
| 3,222,610 | 12/1965 | Evans et al. | 330—19 X |
| 3,241,013 | 3/1966 | Evans | 317—235 |

ROY LAKE, *Primary Examiner.*

N. KAUFMAN, *Assistant Examiner.*